(12) United States Patent
Kawaguchi et al.

(10) Patent No.: US 12,722,624 B2
(45) Date of Patent: Sep. 1, 2026

(54) POWER SUPPLY SYSTEM AND ABNORMALITY DETERMINATION METHOD FOR PRECHARGE DEVICE IN POWER SUPPLY SYSTEM

(71) Applicant: TOYOTA JIDOSHA KABUSHIKI KAISHA, Toyota (JP)

(72) Inventors: Kazuo Kawaguchi, Kasugai (JP); Hiroaki Sugimoto, Kitanagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 40 days.

(21) Appl. No.: 18/948,939

(22) Filed: Nov. 15, 2024

(65) Prior Publication Data

US 2025/0263068 A1 Aug. 21, 2025

(30) Foreign Application Priority Data

Feb. 16, 2024 (JP) ................................ 2024-022116

(51) Int. Cl.
*B60W 20/50* (2016.01)
*B60R 16/023* (2006.01)
(Continued)

(52) U.S. Cl.
CPC ......... *B60W 20/50* (2013.01); *B60R 16/0232* (2013.01); *B60W 50/023* (2013.01); *G01R 31/40* (2013.01)

(58) Field of Classification Search
CPC . B60W 20/50; B60W 50/023; B60R 16/0232; G01R 31/40
(Continued)

(56) References Cited

U.S. PATENT DOCUMENTS

2013/0175857 A1* 7/2013 Shreevani ............... B60L 50/66 307/9.1
2023/0249578 A1* 8/2023 Smith ..................... B60L 55/00 320/109
2024/0351470 A1* 10/2024 Hunley ................... B60L 58/12

FOREIGN PATENT DOCUMENTS

JP 2020-099129 A 6/2020
JP 2020145871 A * 9/2020
JP 2022136781 A * 9/2022

OTHER PUBLICATIONS

JP-2022136781-A translation (Year: 2022).*

* cited by examiner

*Primary Examiner* — Kenneth M Dunne
*Assistant Examiner* — Brian K Palmarchuk
(74) *Attorney, Agent, or Firm* — SoraIP, Inc.

(57) ABSTRACT

A power supply system of the present disclosure includes a power storage device, a power control device that includes a capacitor and is connected to the power storage device, a precharge device that executes precharge of a capacitor of the power control device in response to a system activation request, and a control device that transmits a target voltage of the capacitor to the precharge device in response to the system activation request, determines whether or not there is an abnormality in a communication state with the precharge device, determines whether or not the precharge is completed based on a detection value of a predetermined sensor when an abnormality in a communication state is not determined, determines whether or not the precharge device is normal when the precharge is completed, and determines that an abnormality has occurred in the precharge device when the precharge is not completed.

5 Claims, 2 Drawing Sheets

(51) Int. Cl.
*B60W 50/023* (2012.01)
*G01R 31/40* (2020.01)

(58) Field of Classification Search
USPC .......................................................... 701/29.2
See application file for complete search history.

W
DS
DF
W
V
MG1
PG
MG2
EG
CB
3
31
32
30
MG ECU
HV ECU
10
SS
37
35
HPL
Da
Db
33
Tra
L
Trb
55
CTRL
5
BL
BAT.
4
50
VCC
51
34
36
L.V. Aux.
H.V. Aux
PL
NL
SMRB
SMRG
1
22
21
2

POWER SUPPLY SYSTEM AND ABNORMALITY DETERMINATION METHOD FOR PRECHARGE DEVICE IN POWER SUPPLY SYSTEM

CROSS-REFERENCE TO RELATED APPLICATION

This application claims priority to Japanese Patent Application No. 2024-022116 filed on Feb. 16, 2024, incorporated herein by reference in its entirety.

BACKGROUND

1. Technical Field

The present disclosure relates to a power supply system including a precharge device that precharges a capacitor of a power control device connected to a power storage device, and an abnormality determination method for the precharge device in the power supply system.

2. Description of Related Art

Hitherto, there has been known a power supply system for a vehicle including a battery, an inverter, a step-up converter, a system main relay, a high-voltage capacitor, a low-voltage capacitor, an auxiliary battery, a direct current-to-direct current (DC-DC) converter, and an electronic control unit (see, for example, Japanese Unexamined Patent Application Publication No. 2020-099129 (JP 2020-099129 A)). The electronic control unit of the power supply system controls the system main relay and the DC-DC converter so that the difference between the voltage of the battery and the voltage of the low-voltage capacitor reaches a predetermined voltage when the system main relay is opened in response to a system start-up request. Thus, the electronic control unit performs precharge of the low-voltage capacitor and the high-voltage capacitor.

SUMMARY

When the low-voltage capacitor etc. is precharged, for example, the DC-DC converter may repeat reset and recovery. As in this case, there may occur a trouble that cannot be determined as a communication abnormality between the electronic control unit and the DC-DC converter. In such a case, the power supply system cannot be used. Further, it is difficult to perform appropriate fail-safe operation and repair afterwards because the abnormality diagnosis is not confirmed.

In view of the above, it is a main object of the present disclosure to make appropriate determination on an abnormality of a precharge device that precharges a capacitor of a power control device connected to a power storage device.

A power supply system of the present disclosure includes:

- a power storage device;
- a power control device including a capacitor and connected to the power storage device; and
- a precharge device configured to perform precharge of the capacitor of the power control device in response to a system start-up request.

The power supply system further includes a control device configured to:

- transmit a target voltage of the capacitor to the precharge device in response to the system start-up request;
- determine whether an abnormality has occurred in a communication state with the precharge device;
- when the abnormality of the communication state is not determined, determine whether the precharge is completed based on a detected value from a predetermined sensor;
- when the precharge is completed, determine that the precharge device is normal; and
- when the precharge is not completed, determine that an abnormality has occurred in the precharge device.

The control device of the power supply system of the present disclosure transmits the target voltage of the capacitor to the precharge device in response to the system start-up request, and determines whether an abnormality has occurred in the communication state with the precharge device. When the abnormality of the communication state with the precharge device is not determined, the control device determines whether the precharge is completed based on a detected value from the predetermined sensor. The control device determines that the precharge device is normal when the precharge is completed, and determines that an abnormality has occurred in the precharge device when the precharge is not completed. Thus, even when determination cannot be made that the communication state between the control device and the precharge device is unstable and an abnormality has occurred in the communication state, it is possible to make appropriate determination on the abnormality of the precharge device that precharges the capacitor of the power control device connected to the power storage device.

An abnormality determination method for a precharge device in a power supply system according to the present disclosure is

- an abnormality determination method for a precharge device in a power supply system including a power storage device, a power control device including a capacitor and connected to the power storage device, and the precharge device configured to perform precharge of the capacitor of the power control device in response to a system start-up request. The abnormality determination method includes:
- transmitting a target voltage of the capacitor to the precharge device in response to the system start-up request;
- determining whether an abnormality has occurred in a communication state with the precharge device;
- when the abnormality of the communication state is not determined, determining whether the precharge is completed based on a detected value from a predetermined sensor;
- when the precharge is completed, determining that the precharge device is normal; and
- when the precharge is not completed, determining that an abnormality has occurred in the precharge device.

With such a method, even when determination cannot be made that the communication state between the control device and the precharge device is unstable and an abnormality has occurred in the communication state, it is possible to make appropriate determination on the abnormality of the precharge device that precharges the capacitor of the power control device connected to the power storage device.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Embodiments of the present disclosure will now be described with reference to the drawings.

Figure 1:
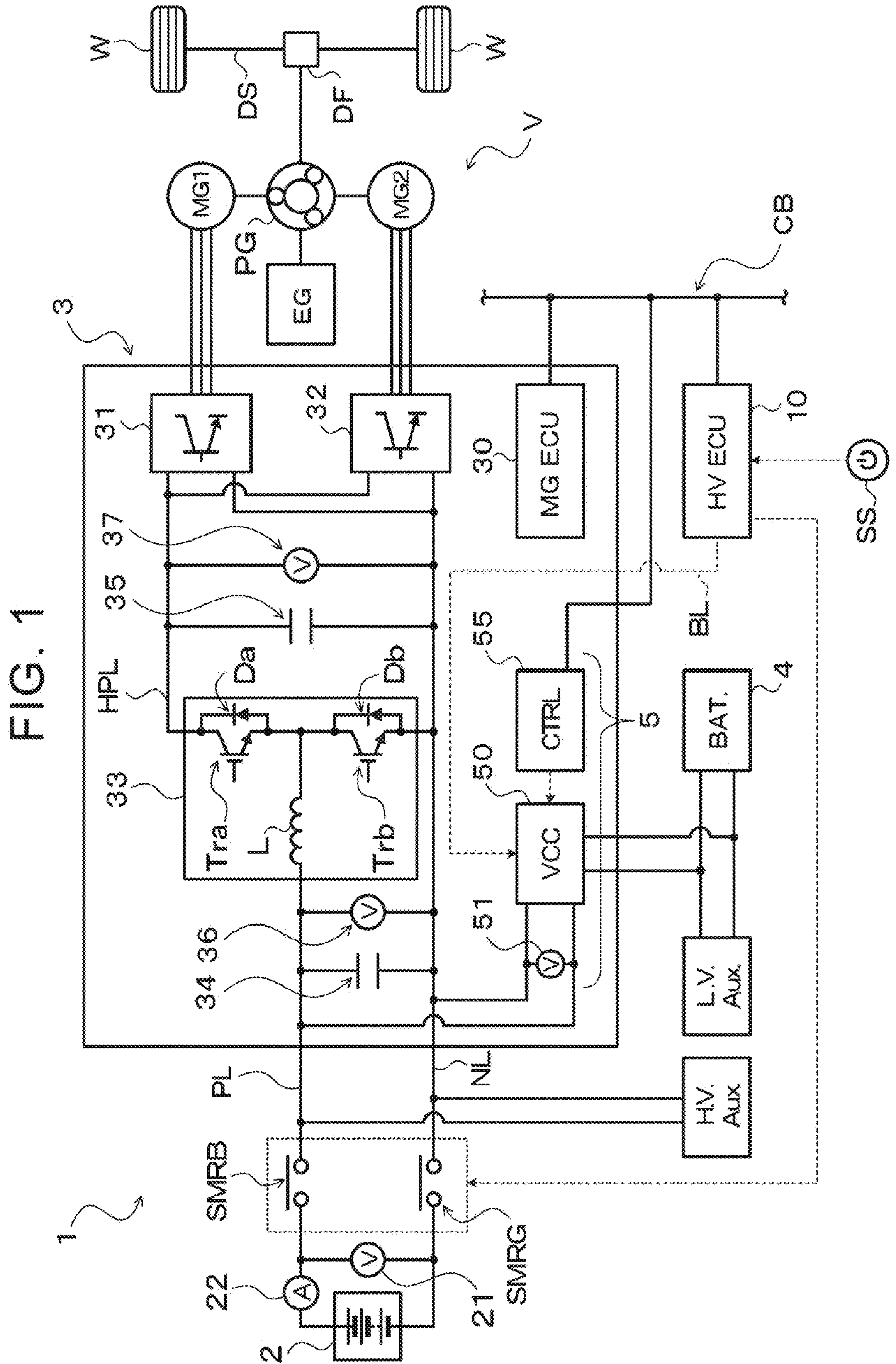
FIG. 1 is a schematic diagram illustrating a power supply system according to an embodiment of the present disclosure.

FIG. 1 is a schematic configuration diagram illustrating a hybrid electric vehicle V as a vehicle including a power supply system 1 of the present disclosure. Hybrid electric vehicle V shown in the drawing includes, in addition to the power supply system 1, an engine EG, a single-pinion planetary gear PG, motor generators MG1 and MG2 for exchanging electric power with the power supply system 1, and a hybrid electronic control unit (hereinafter referred to as "HV ECU") 10 for controlling the entire vehicle. Further, the power supply system 1 includes a high-voltage battery (power storage device) 2, a power control device (hereinafter referred to as "PCU") 3, a positive-electrode-side system main relay SMRB (hereinafter referred to as "positive-electrode-side relay SMRB"), a negative-electrode-side system main relay SMRG (hereinafter referred to as "negative-electrode-side relay SMRG"), a low-voltage battery (second power storage device) 4, and bidirectional DC/DC converters (voltage converters) 5. PCU 3 exchanges power with the high-voltage battery 2 to drive the motor generators MG1 and MG2. The voltage of the low-voltage battery 4 is lower than the voltage of the high-voltage battery 2.

The engine EG is an internal combustion engine that generates power by exploding and burning an air-fuel mixture of hydrocarbon-based fuels such as gasoline, gas oil, and LPG, and is controlled by an engine electronic control unit (not shown). The planetary gear PG includes a sun gear connected to a motor generator MG1 (rotor), a ring gear connected to an output shaft, and a planetary carrier. The planetary carrier rotatably supports a plurality of pinion gears and is coupled to a crankshaft of the engine EG. The output shaft is connected to the left and right wheels (drive wheels) W via a differential gear DF and a drive shaft DS.

The motor generator MG1, MG2 is a synchronous generator motor (three-phase AC motor). The motor generator MG1 mainly operates as a generator that is driven by a load-operated engine EG to generate electric power. The motor generator MG2 is connected to the output shaft via a reduction gear (not shown). The motor generator MG2 is mainly driven by at least one of the electric power from the high-voltage battery 2 and the electric power from the motor generator MG1. The motor generator MG2 operates as an electric motor that outputs a driving torque to the output shaft. Further, the motor generator MG2 outputs regenerative braking torque to the output shaft when hybrid electric vehicle V is braked. These motor generators MG1 and MG2 are capable of exchanging electric power with the high-voltage battery 2 via a PCU 3 and exchanging electric power with each other via PCU 3.

HV ECU 10 includes a microcomputer having a CPU, ROM, RAM, an input/output interface, and the like (not shown), various driving circuitry, various logic IC, and the like. HV ECU 10 is connected to an engine-electronic control device (not shown) or the like via a hybrid electric vehicle V shared communication line CB that is a CAN bus. In addition, HV ECU 10 is connected to various sensors such as a start switch SS, an accelerator pedal position sensor, a shift position sensor, and a vehicle speed sensor. When hybrid electric vehicle V is traveling, HV ECU 10 sets a required torque required for traveling on the basis of the accelerator operation amount and the vehicle speed. HV ECU 10 sets the required power to the engine EG, the target rotational speed, the torque command for the motor generator MG1, MG2, and the like.

The high-voltage battery 2 of the power supply system 1 is, for example, a lithium-ion secondary battery or a nickel-hydrogen secondary battery having a 200 to 800 V rated output voltage. The positive-electrode-side power line PL is connected to the positive electrode terminal of the high-voltage battery 2 via the positive-electrode-side relay SMRB, and the negative-electrode-side power line NL is connected to the negative electrode terminal of the high-voltage battery 2 via the negative-electrode-side relay SMRG. The high-voltage battery 2 includes a voltage sensor 21 that detects an inter-terminal voltage VB of the high-voltage battery 2, and a current sensor 22 that detects a current (charge-discharge current) IB flowing through the high-voltage battery 2. The inter-terminal voltage VB of the high-voltage battery 2 detected by the voltage sensor 21 and the current IB detected by the current sensor 22 are directly transmitted to HV ECU 10 via a signal line (not shown). Alternatively, the current IB is transmitted to HV ECU 10 via the shared communication line CB by a battery electronic control device (not shown) that manages the high-voltage battery 2.

In the present embodiment, the positive-electrode-side relay SMRB and the negative-electrode-side relay SMRG are normally open relays of a reed type (mechanical type) including a coil, a movable contact, and a fixed contact, and are controlled to be opened and closed by an HV ECU 10. That is, HV ECU 10 outputs a closing command to the positive-electrode-side and negative-electrode-side relays SMRB, SMRG when the start switch SS is turned on by the driver and the system activation of hybrid electric vehicle V (and the power supply system 1) is requested. When the positive-electrode-side and negative-electrode-side relays SMRB, SMRG are normally closed, the high-voltage battery 2 and PCU 3 are electrically connected to each other.

When the start switch SS is turned off by the driver and the system shutdown of hybrid electric vehicle V (and the power supply system 1) is requested, HV ECU 10 issues an opening command to the positive-electrode-side and negative-electrode-side relays SMRB, SMRG. As a result, the positive-electrode-side and negative-electrode-side relays SMRB, SMRG are opened, and the high-voltage battery 2 and PCU 3 are electrically disconnected from each other. The positive-electrode-side relay SMRB and the negative-electrode-side relay SMRG may be a contact-type hybrid relay or a semi-conductor relay that does not include a coil.

PCU 3 of the power supply system 1 includes a first inverter 31, a second inverter 32, a step-up/step-down converter 33, and a motor electronic control unit (hereinafter referred to as "MG ECU") 30. The first inverter 31 drives the motor generator MG1, and the second inverter 32 drives the motor generator MG2. The first and second inverters 31 and 32 include six transistors (e.g., insulated-gate bipolar transistors (IGBT)) (not shown) and six diodes (not shown) connected in parallel to the transistors in opposite directions.

The step-up/step-down converter 33 can step up the power from the high-voltage battery 2 and step down the voltage from the motor generator MG1, MG2. As shown in FIG. 1, the step-up/step-down converter 33 includes two transistors (for example, insulated-gate bipolar transistors) Tra, Trb, two diode Da, Db, and a reactor L. The two diodes Da, Db are connected in parallel opposite to the respective transistors Tra, Trb. MG ECU 30 includes a microcomputer having a CPU, ROM, RAM, an input/output interface, and the like (not shown), various drive circuits, various logic IC, and the like, and is connected to an HV ECU 10 or the like via a shared communication line CB. MG ECU 30 controls the first and second inverters 31 and 32 and the step-up/step-down converter 33.

Further, PCU 3 includes a filter capacitor (first capacitor) 34, a smoothing capacitor (second capacitor) 35, and voltage sensors 36 and 37. The positive terminal of the filter capacitor 34 is electrically connected between the positive-electrode-side relay SMRB and the step-up/step-down converter 33 to the positive-electrode-side power line PL (one end of the reactor L). The negative terminal of the filter capacitor 34 is electrically connected between the negative-electrode-side relay SMRG and the step-up/step-down converter 33 to the negative-electrode-side power line NL. Thus, the filter capacitor 34 smoothes the voltage on the high-voltage battery 2 side of the step-up/step-down converter 33. Further, the voltage sensor 36 detects a voltage VL between terminals of the filter capacitor 34 (voltage before boosting).

The positive terminal of the smoothing capacitor 35 is electrically connected to the high-voltage power line HPL (the collector of the transistor Tra of the step-up/step-down converter 33) between the step-up/step-down converter 33 and the first and second inverters 31 and 32. The negative terminal of the smoothing capacitor 35 is electrically connected between the step-up/step-down converter 33 and the first and second inverters 31 and 32 to the negative-electrode-side power line NL and the emitter of the transistor Trb of the step-up/step-down converter 33. Thus, the smoothing capacitor 35 smoothes the voltage of the step-up/step-down converter 33 on MG1, MG2 of the motor generator. Further, the voltage sensor 37 detects a voltage VH between terminals of the smoothing capacitor 35 (voltage after boosting). The inter-terminal voltage VL of the filter capacitor 34 detected by the voltage sensor 36 and the inter-terminal voltage VH of the smoothing capacitor 35 detected by the voltage sensor 37 are transmitted to MG ECU 30. In addition, the inter-terminal voltage VL and the inter-terminal voltage VH are directly transmitted to HV ECU 10 via a signal line (not shown). Alternatively, the inter-terminal voltage VL and the inter-terminal voltage VH are transmitted to HV ECU 10 via the shared communication line CB by MG ECU 30.

MG ECU 30 acquires a command signal from HV ECU 10, a rotational position of the rotor of the motor generator MG1, a rotational position of the rotor of the motor generator MG2, a current value from a current sensor (not shown) of the step-up/step-down converter 33, a voltage VL, VH between terminals from the voltage sensors 36 and 37, a phase current applied to the motor generator MG1, MG2, and the like. MG ECU 30 generates gate signals (switching control signals) to the first and second inverters 31 and 32 and the step-up/step-down converter 33 on the basis of these signals and the like, and performs switching control on them.

The low-voltage battery 4 of the power supply system 1 is, for example, a lead-acid battery having a rated output voltage of about 12 to 14 V, and is connected to a plurality of auxiliary devices (low-voltage auxiliary devices) via a low-voltage power line. The bidirectional DC/DC converters (DDC) 5 are connected between the positive-electrode-side relay SMRB and PCU 3 to the positive-electrode-side power line PL, and are connected between the negative-electrode-side relay SMRG and PCU 3 to the negative-electrode-side power line NL. The bidirectional DC/DC converters 5 are connected to the low-voltage battery 4 and a plurality of accessories via the low-voltage power lines. In addition to the bidirectional DC/DC converter 5, a high-voltage auxiliary device such as a compressor (inverter compressor) of an air-conditioning device or a converter to an AC 100 V is connected to the positive-electrode-side power line PL and the negative-electrode-side power line NL.

The bidirectional DC/DC converter 5 lowers the power on the positive-electrode-side power line PL, that is, on the high-voltage battery 2 and PCU 3 (step-up/step-down converter 33) side, and supplies the reduced power to the low voltage power line side, that is, the various accessories and the low-voltage battery 4. In addition, the bidirectional DC/DC converters 5 can boost the power from the low-voltage battery 4 and supply the boosted power to the positive-electrode-side power line PL, that is, the high-voltage battery 2 and PCU 3. In the present embodiment, the bi-directional DC/DC converter 5 includes a voltage conversion circuit 50, a voltage sensor 51, a voltage sensor (not shown), and a control circuit 55. The voltage sensor 51 detects the voltage of the high-voltage battery 2 and PCU 3 of the voltage conversion circuit 50. A voltage sensor (not shown) detects a voltage on the low-voltage battery 4 side of the voltage conversion circuit 50, and the control circuit 55 performs feedback control of the voltage conversion circuit 50 so that a detection value of the voltage sensor 51 becomes a required value. As shown in FIG. 1, the control circuit 55 of the bi-directional DC/DC converters 5 is connected to HV ECU 10 via hybrid electric vehicle V shared communication lines (CAN busses) CB.

The start switch SS is turned on by the driver and the system start of hybrid electric vehicle V (power supply system 1) is required. The bidirectional DC/DC converters (voltage conversion circuits 50) boost the power from the low-voltage battery 4 as a power source and supply the boosted power to PCU 3 prior to closing the positive-electrode-side and negative-electrode-side relays SMRB, SMRG. That is, HV ECU 10 transmits the target voltage Vtag to the control circuit 55 via the shared communication line CB, and the control circuit 55 feedback-controls the voltage conversion circuit 50 so that the detected value of the voltage sensor 51 becomes the target value. The target voltage Vtag is a required voltage outputted from the voltage conversion circuit 50 in response to a system-start request. Accordingly, PCU 3 filter capacitor 34 and the smoothing capacitor 35 are precharged (recharged) prior to the closing of the positive-electrode-side and negative-electrode-side relay SMRB, SMRG. When the positive-electrode-side and negative-electrode-side relays SMRB, SMRG are closed, a large inrush current can be suppressed from flowing in the positive-electrode-side power line PL or PCU 3.

Further, in the present embodiment, the voltage conversion circuit 50 of the bidirectional DC/DC converter 5 is connected to HV ECU 10 via a backup communication line (Zika line) BL. HV ECU 10 transmits a precharge starting command to the voltage conversion circuit 50 via the backup communication line BL so as to execute precharge of the filter capacitor 34 and the smoothing capacitor 35 as needed. Further, HV ECU 10 transmits the precharge stopping command to the voltage conversion circuit 50 via the backup communication line BL at a stage when the predetermined condition is satisfied after transmitting the precharge starting command. This stops the precharge of the filter capacitor 34 and the smoothing capacitor 35.

Figure 2:
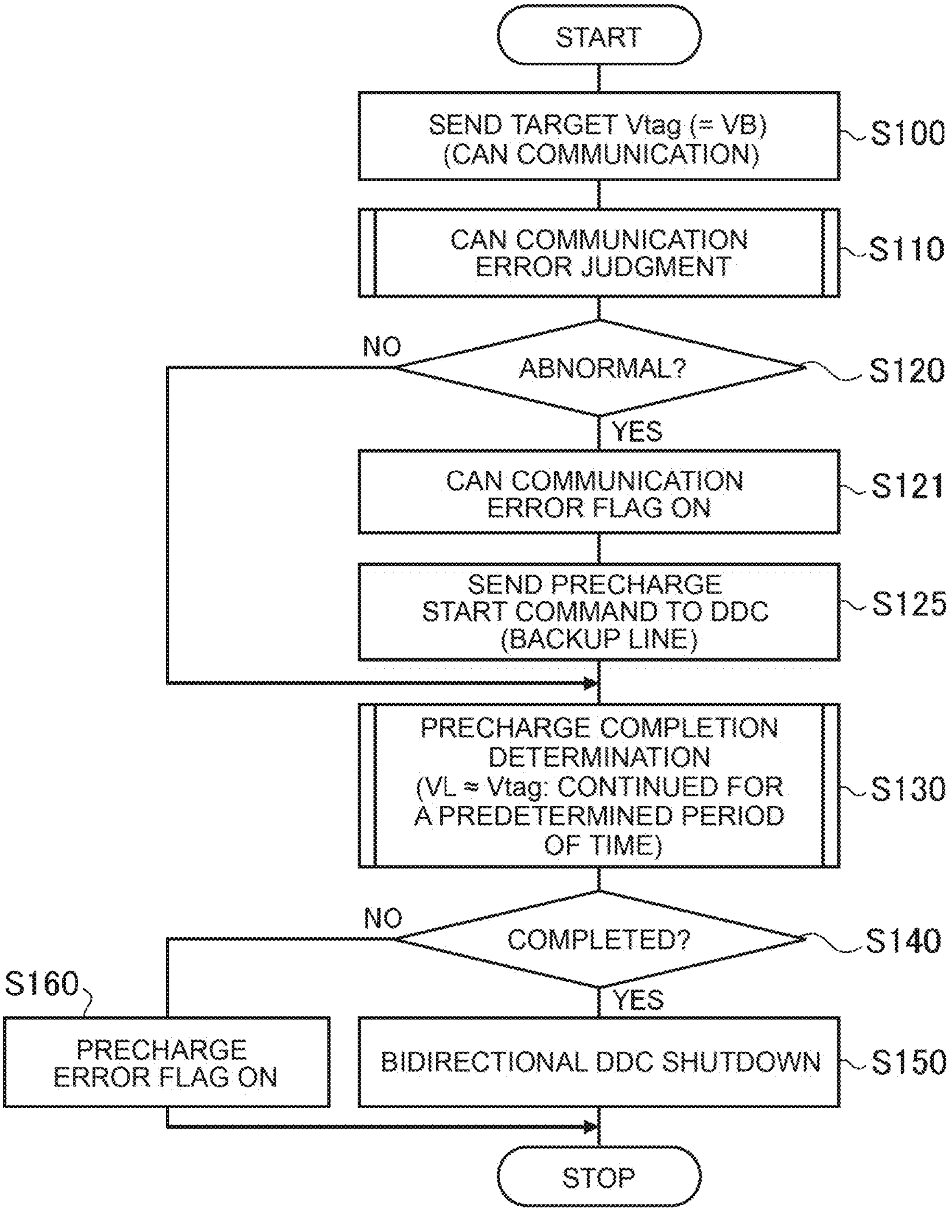
FIG. 2 is a flowchart illustrating an example of a routine executed by a control device of the power supply system of the present disclosure.

Next, referring to FIG. 2, a control sequence of the power supply system 1 when the start switch SS is turned on by the driver and hybrid electric vehicle V is activated by the system will be described. FIG. 2 is a flow chart illustrating an exemplary routine executed by HV ECU 10 when the start switch SS is turned on and a hybrid electric vehicle V system-start is requested.

When the start switch SS is turned on by the driver, as shown in FIG. 2, HV ECU 10 (CPU) acquires the inter-terminal voltage VB of the high-voltage battery 2 detected by the voltage sensor 21 (S100). Further, in S100, HV ECU 10 sets the acquired inter-terminal voltage VB to the target voltage Vtag of the filter capacitor 34 and the smoothing capacitor 35 (precharge) of PCU 3. In addition, HV ECU 10 transmits the target-voltage Vtag to the control circuit 55 of the bi-directional DC/DC converter 5 via the shared communication line CB.

When no anomaly occurs in CAN communication via the shared communication line CB or in the bidirectional DC/DC converter 5, the control circuit 55 starts feedback-control of the voltage conversion circuit 50 with the positive-electrode-side and negative-electrode-side relays SMRB, SMRG open. In the feedback control, the detected value of the voltage sensor 51 becomes the target voltage Vtag from HV ECU 10. Further, when the detection value of the voltage sensor 51 becomes the target voltage Vtag, the control circuit 55 performs feedback-control of the voltage conversion circuit 50 so that the detection value is maintained at the target voltage Vtag.

Further, HV ECU 10 transmits the target-voltage Vtag to the control circuit 55 of the bidirectional DC/DC converter 5, and then determines whether or not an anomaly has occurred in CAN communication via the shared communication line CB in accordance with a predetermined sequence (S110). When no abnormality is recognized in CAN communication via the shared communication line CB, that is, when the abnormality of CAN communication is not determined (S120: NO), HV ECU 10 acquires the inter-terminal voltage VL of the filter capacitor 34 detected by the voltage sensor 36. HV ECU 10 determines whether or not the precharge of the filter capacitor 34 or the like is completed based on the acquired inter-terminal voltage VL and the target voltage Vtag set by S100 (S130). In S130, for example, HV ECU 10 determines whether or not a condition in which the inter-terminal voltage VL of the filter capacitor 34 is equal to or greater than a threshold (predetermined value) Vref obtained by subtracting a predetermined relatively small positive value from the inter-terminal voltage VB of the high-voltage battery 2 has continued for a predetermined period of tref.

HV ECU 10 determines that the power line PL DC/DC converter 5 or the like is normal and the precharge of the filter capacitor 34 or the like by the bidirectional DC/DC converter 5 is completed (S140: YES) when the inter-terminal voltage VL of the filter capacitor 34 is equal to or higher than the threshold Vref for a period of tref. In order to stop the operation of the bidirectional DC/DC converters 5, HV ECU 10 transmits a precharge stop command to the control circuit 55 via the shared communication line CB (S150), and terminates the routine of FIG. 2.

If the condition in which the inter-terminal voltage VL of the filter capacitor 34 is equal to or higher than the threshold Vref is not continued for a predetermined period of tref, HV ECU 10 determines that an abnormality or disconnection of the bidirectional DC/DC converter 5 has occurred and that the precharge of the filter capacitor 34 or the like by the bidirectional DC/DC converter 5 has not been completed normally (S140: NO). In this case, HV ECU 10 turns on the precharge abnormality flag indicating that an abnormality or disconnection of the bidirectional DC/DC converters 5 has occurred. In addition, HV ECU 10 turns on a predetermined warning light provided on an instrument panel (not shown) or the like (S160), and ends the routine of FIG. 2. When the precharge abnormality flag is turned on in S160, HV ECU 10 prohibits the operation of the power supply system 1, the transition to READY-ON state (travel permitted state) in which hybrid electric vehicle V is permitted to travel, and the operation of the bidirectional DC/DC converters 5.

When an abnormality occurs in CAN communication via the shared communication line CB, that is, when the abnormality of CAN communication is determined (S120: YES), HV ECU 10 turns on CAN communication abnormality flag indicating that an abnormality has occurred in CAN communication (S121). Further, HV ECU 10 transmits a precharge starting command to the voltage conversion circuit 50 of the bidirectional DC/DC converter 5 via the backup communication line BL (S125). The voltage conversion circuit 50 of the bidirectional DC/DC converter 5 boosts the power from the low-voltage battery 4 in accordance with a pre-charge starting command and supplies the boosted power to PCU 3 filter capacitor 34 and the smoothing capacitor 35. Thus, the filter capacitor 34 and the smoothing capacitor 35 are precharged by the electric power from the voltage conversion circuit 50.

After S125 process, HV ECU 10 acquires the inter-terminal voltage VL of the filter capacitor 34 and determines whether or not the pre-charge of the filter capacitor 34 or the like has been completed by comparing the acquired inter-terminal voltage VL with the threshold Vref (S130). HV ECU 10 determines that the bidirectional DC/DC converter 5 or the like is normal and the precharge of the filter capacitor 34 or the like by the bidirectional DC/DC converter 5 is completed (S140: YES) when the inter-terminal voltage VL of the filter capacitor 34 is equal to or higher than the threshold Vref for the above-mentioned period of tref. Since CAN communication error flag is turned on in S121, HV ECU 10 transmits a precharge stop command to the control circuit 55 via the backup communication line LB (S150). This deactivates the operation of the bi-directional DC/DC converters 5. HV ECU 10 then terminates the routine of FIG. 2. HV ECU 10 then transitions hybrid electric vehicle V (and power supply system 1) to a fail-safe mode corresponding to an anomaly in CAN communication.

If the condition in which the inter-terminal voltage VL of the filter capacitor 34 is equal to or higher than the threshold Vref is not continued for a predetermined period of tref, HV ECU 10 determines that an anomaly has occurred in the bidirectional DC/DC converter 5 or the like, and that the pre-charging of the filter capacitor 34 or the like by the bidirectional DC/DC converter 5 has not been completed normally (S140: NO). HV ECU 10 turns on the precharge fault flag and turns on the predetermined warning light (S160) to terminate the routine of FIG. 2. HV ECU 10 then transitions hybrid electric vehicle V (and power supply system 1) to a fail-safe mode corresponding to an anomaly in CAN communication. HV ECU 10 prohibits the transition to READY-ON state (travel permitted state) and the operation of the bidirectional DC/DC converters 5 in response to the pre-charge abnormal flag being turned on.

As described above, HV ECU 10 as the control device of the power supply system 1 transmits the target voltage Vtag of PCU 3 filter capacitor 34 and the smoothing capacitor 35 to the control circuit 55 of the bidirectional DC/DC converter 5 as the precharge device in response to the system start-up demand by operating the start switch SS (S100). In addition, HV ECU 10 determines whether or not there is an anomaly in CAN communication with the bidirectional DC/DC converters 5 (control circuit 55) (S110). HV ECU 10 determines whether or not the precharge has been completed based on the detected value of the voltage sensor 36, that is, the voltage VL between terminals of the filter capacitor 34 (S130), when the abnormality of CAN communication with the bidirectional DC/DC converter 5 is not determined (S120: NO). Then, HV ECU 10 determines that the bidirectional DC/DC converters 5 and the like are normal when the precharge is completed (S140: YES, S150). When the precharge is not completed, HV ECU 10 determines that an anomaly has occurred in the bidirectional DC/DC converters 5 and the like (S140: NO, S160). Accordingly, the abnormality of the power line PL DC/DC converter 5 or the like can be appropriately determined even when it cannot be determined that HV ECU 10 and the bidirectional DC/DC converter 5 (control circuit 55) have unstable CAN communication and an abnormality has occurred in the communication state (CAN communication) between the two. The bi-directional DC/DC converter 5 performs pre-charging of PCU 3 filter capacitor 34 and the smoothing capacitor 35 connected to the high-voltage battery 2.

Further, in the above-described embodiment, the bi-directional DC/DC converters 5 are connected to HV ECU 10 via the backup communication line BL. Furthermore, when the anomaly of CAN communication is determined (S120: YES), HV ECU 10 transmits a precharge starting command to the bidirectional DC/DC converter 5 via the backup communication line BL (S125). In addition, HV ECU 10 determines whether or not the precharge has been completed based on the detected value (the inter-terminal voltage VL) of the voltage sensor 36 after the precharge starting command is transmitted (S130). Then, HV ECU 10 determines that the bidirectional DC/DC converters 5 and the like are normal when the precharge is completed (S140: YES, S150). HV ECU 10 determines that an anomaly has occurred in the bidirectional DC/DC converters 5 and the like when the precharge has not been completed (S140: NO, S160). Thus, the abnormality of the bidirectional DC/DC converter 5 or the like can be appropriately determined even when it is determined that an abnormality has occurred in CAN communication (communication state) between HV ECU 10 and the bidirectional DC/DC converter 5. The bi-directional DC/DC converter 5 performs pre-charging of PCU 3 filter capacitor 34 and the smoothing capacitor 35.

HV ECU 10 determines that the precharge has been completed (S130, S140: YES) when the state in which the voltage VL between the terminals of the filter capacitor 34 detected by the voltage sensor 36 is equal to or higher than the threshold (predetermined value) Vref continues for a time tref (predetermined time) or longer. This makes it possible to properly determine whether or not the precharge has been completed. The determination process in S130 may determine whether both the inter-terminal voltage VL of the filter capacitor 34 and the inter-terminal voltage VH of the smoothing capacitor 35 have fluctuated following the target voltage Vtag. Alternatively, the determination process may be a process of determining whether or not the inter-terminal voltage VH of the smoothing capacitor 35 fluctuates following the target voltage Vtag.

Hybrid electric vehicle V includes a low-voltage battery 4 and bi-directional DC/DC converters 5. The voltage of the low-voltage battery 4 is lower than the voltage of the high-voltage battery 2. The bi-directional DC/DC converters 5 are precharge devices connected to HV ECU 10 via shared communication line CB (CAN busses). The bidirectional DC/DC converter 5 adjusts the power from the low-voltage battery 4 to the target voltage Vtag in response to the system-start-up demand, and precharges the filter capacitor 34 and the smoothing capacitor 35 of PCU 3. Accordingly, PCU 3 filter capacitor 34 and the smoothing capacitor 35 can be precharged by using the power of the low-voltage battery 4.

When hybrid electric vehicle V is a plug-in hybrid electric vehicle (PHEV), an external charging device such as a charger connected to a household power supply or a charger installed in a stand may be used as the precharge device. The filter capacitor 34 or the like may be precharged by adjusting the electric power from the external charger to the target voltage Vtag. In this case, for example, when the communication state between the control device of hybrid electric vehicle V and the external charging device is unstable and it is not determined that an abnormality has occurred in the communication state (CAN communication) between the control device and the external charging device, S130 to S160 process of FIG. 2 may be executed.

In addition, a precharge circuit including a precharge relay and a resistor may be incorporated in parallel with the negative-electrode-side system main relay SMRG with respect to, for example, the negative-electrode-side power line NL of the power supply system 1. In such a power supply system 1, S130 to S160 of FIG. 2 may be executed when it is not determined that an error has occurred in the communication state between the control device such as HV ECU 10 and the precharge circuit. Furthermore, the bi-directional DC/DC converter 5 may be replaced by a DC/DC converter which does not have the function of boosting the power from the low-voltage battery 4.

In the power supply system 1, the back-up communication line BL between the bidirectional DC/DC converters 5 (the voltage conversion circuits 50) and HV ECU 10 may be omitted. Here, S130 to S160 of FIG. 2 only needs to be executed when the anomaly of CAN communication is not determined (S120: NO).

In addition, the vehicles including the above-described power supply system 1 are not limited to a two-motor type (series-parallel type) hybrid electric vehicle V having a planetary gear PG for power distribution. In other words, the vehicles on which the power supply system 1 is mounted may be a one-motor hybrid electric vehicle, a series-type hybrid electric vehicle, or a parallel-type hybrid electric vehicle, battery electric vehicle (BEV).

It is needless to say that the present disclosure is not limited to the above-described embodiments, and various modifications can be made within the scope of the extension of the present disclosure. Furthermore, the above-described embodiment is only a specific form of the disclosure described in the column of the outline of the disclosure, and does not limit the elements of the disclosure described in the column of the outline of the disclosure.

The present disclosure can be used in a manufacturing industry of a power supply system and the like.

What is claimed is:

1. A power supply system comprising:

a first battery a power control device that includes a first inverter, a second inverter, a step-up/step-down converter, a capacitor, and a first processor, the power control device being connected to the first battery;

a bi-directional DC/DC converter (5) configured to pre-charge of the capacitor of the power control device in response to a system start-up request; and a second processor configured to transmit a target voltage of the capacitor to the bi-directional DC/DC converter in response to the system start-up request, determine whether an abnormality has occurred in a communication state with the bi-directional DC/DC converter, when the second processor determines that the abnormality has not occurred, the second processor then determines whether the precharge of the capacitor is completed based on a detected value from a voltage sensor configured to detect a voltage of the capacitor, determine that the bi-directional DC/DC converter is normal when the precharge is completed, and determine that an abnormality has occurred in the bi-directional DC/DC converter when the pre-charge is not completed, wherein the second processor determines that the precharge is completed when the detected voltage from the voltage sensor remains equal to or greater than a predetermined voltage for at least a predetermined time period.

2. The power supply system according to claim 1, further comprising a second battery having a lower voltage than the first battery, wherein:

the bi-directional DC/DC converter is configured to pre-charge the capacitor by adjusting electric power from the second battery to the target voltage; and the second processor is configured to set the target voltage in response to the system start-up request, transmit the target voltage to a control circuit of the bi-directional DC/DC converter via controller area network communication, and determine whether an abnormality has occurred in the controller area network communication.

3. The power supply system according to claim 2, wherein: the DC/DC converter is connected to the second processor via a backup communication line; and the second processor is configured to:

when the abnormality of the controller area network communication is determined, transmit a precharge start command to the bi-directional DC/DC converter via the backup communication line, determine whether the precharge is completed based on the detected value from the predetermined sensor after the precharge start command is transmitted, when the precharge is completed, determine that the bi-directional DC/DC converter is normal, and when the precharge is not completed, determine that an abnormality has occurred in the bi-directional DC/DC converter.

4. An abnormality determination method for a bi-directional DC/DC converter in a power supply system including a first battery, a power control device that includes a first inverter, a second inverter, a step-up/step-down converter, a capacitor and that is connected to the first battery, and the bi-directional DC/DC converter configured to precharge the capacitor of the power control device in response to a system start-up request, the abnormality determination method comprising:

transmitting a target voltage of the capacitor to the bi-directional DC/DC converter in response to the system start-up request;

determining whether an abnormality has occurred in a communication state with the bi-directional DC/DC converter; wherein, when the abnormality of the communication state is not determined it is determined that the abnormality has not occurred, then determining whether the precharge of the capacitor is completed based on a detected value voltage from a predetermined voltage sensor configured to detect a voltage of the capacitor; when the precharge is completed, determining that the bi-directional DC/DC converter is normal when the precharge is completed; and determining that an abnormality has occurred in the bi-directional DC/DC converter when the precharge is not completed, wherein the precharge is determined as being completed when the detected voltage from the voltage sensor remains equal to or greater than a predetermined voltage for at least a predetermined time period.

5. The power supply system according to claim 1, wherein an external charging device is configured to precharge the capacitor of the power control device by adjusting the electric power from the external charger to the target voltage.

* * * * *